United States Patent [19]

Ericksson

[11] 4,352,136
[45] Sep. 28, 1982

[54] IMPEDANCE-MEASURING DEVICE FOR IMPEDANCE PROTECTION

[75] Inventor: Leif Ericksson, Sala, Sweden
[73] Assignee: Asea Aktiebolag, Vasteras, Sweden
[21] Appl. No.: 181,656
[22] Filed: Aug. 26, 1980
[30] Foreign Application Priority Data
Aug. 30, 1979 [SE] Sweden ................ 7907212
[51] Int. Cl.³ .............................. H02H 3/26
[52] U.S. Cl. .......................... 361/80; 361/79
[58] Field of Search .................. 361/79, 80
[56] References Cited
U.S. PATENT DOCUMENTS
3,890,544 6/1975 Chamia ............... 361/80

Primary Examiner—Reinhard J. Eisenzopf
Attorney, Agent, or Firm—Watson, Cole, Grindle & Watson

[57] ABSTRACT

In an impedance-measuring device for impedance protection, the phase positions of a plurality of alternating-current quantities are compared with the aid of a phase comparator. From the output signal thereof it is clear whether the impedance in a fault loop with a voltage $\bar{U}$ and a current $\bar{I}$ lies inside or outside an impedance zone, which is defined by means of a model impedance, $\bar{Z}_k = \bar{R} + j\bar{X}$. The comparator is supplied with input quantities corresponding to $\bar{IX}$, $\bar{U}_k$, $\bar{I}$ and preferably also $\bar{U}_p$, where $\bar{U}_k = \bar{U} - \bar{IZ}_k$, whereas $\bar{U}_p$ relates to a voltage which is phase-shifted $-90°$ with respect to $\bar{U}$. Quantities corresponding to $\bar{IX}$, $\bar{U}_p$ and I are each supplied to one input of a second logic component. This second logic component also has an input which is connected, via a delay element, to the output of a first logic component, the two inputs of which are supplied with quantities corresponding to $\bar{I}$ and $\bar{U}_k$, respectively.

6 Claims, 9 Drawing Figures

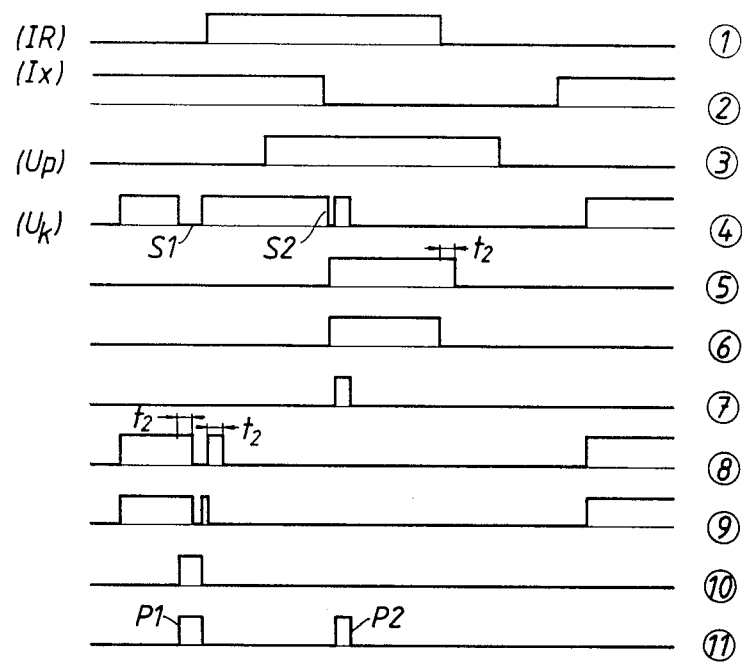
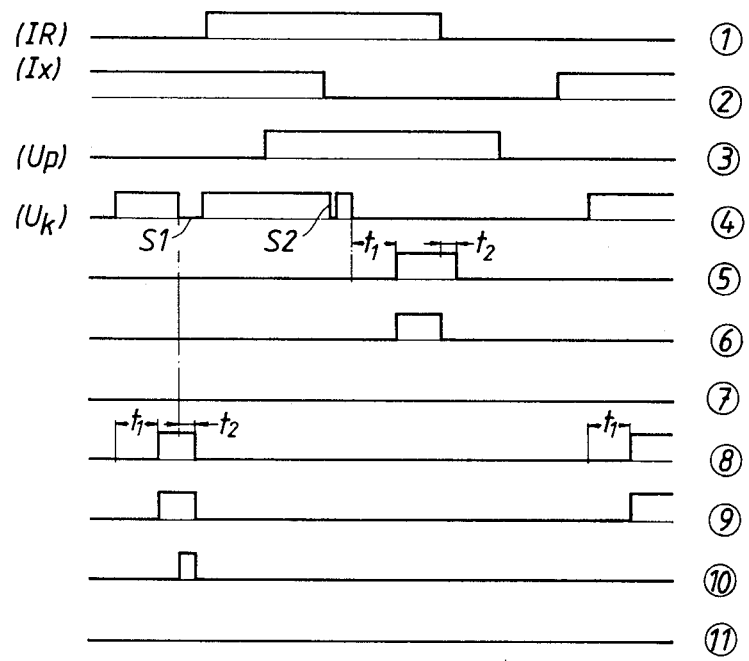

IMPEDANCE-MEASURING DEVICE FOR IMPEDANCE PROTECTION

TECHNICAL FIELD

This invention relates to an impedance-measuring device for the impedance protection of an electric power line, the device being of the kind comprising a comparator means built up from logic components for comparing the phase positions of a plurality of alternating current quantities which together contain information of such a nature that a phase comparison of said quantities is sufficient to obtain a criterion of whether the impedance in a fault loop lies inside or outside certain limits of an impedance zone which are defined by means of a model impedance, $\overline{Z}_k = \overline{R} + j\overline{X}$; said alternating current quantities being transformed into signals containing only polarity information, said signals each being supplied to an input of at least one comparator means which is adapted to supply a specified output signal only when the supplied signals constitute a combination of logic levels for which the impedance of the fault loop lies inside said limits, one of said signals corresponding to the current $\overline{I}$ in the fault loop.

BACKGROUND ART

Devices of the above kind are known, for example, from Swedish Patent Specification No. 356,407 and British Patent Specification No. 1,444,774. However, in these known devices a disturbance (e.g. an interference pulse) on the input signals may generate a pulse on the output of the device, resulting in unintentional tripping. Furthermore, determination of the resistance and the reactance in separate circuits on separate measuring occasions requires the use of a large number of components in the device.

If phase comparators of the integrating type are used for reducing the effect of the said disturbances, these integrations will affect the shape of the output signal requiring the use of time-determining components of high accuracy. In addition, the integrations considerably increase the operating times in the case of distorted input signals.

The present invention aims to provide an impedance-measuring device of the kind referred to which does not have the above-mentioned drawbacks.

DISCLOSURE OF INVENTION

According to the invention there is provided an impedance-measuring device for the impedance protection of an electric power line, comprising a comparator means built up from logic components for comparing the phase positions of a plurality of alternating current quantities which together contain information of such a nature that a phase comparison of said quantities is sufficient to obtain a criterion of whether the impedance in a fault loop lies inside or outside certain limits of an impedance zone which are defined by means of a model impedance, $\overline{Z}_k = \overline{R} + j\overline{X}$; said alternating current quantities being transformed into signals containing only polarity information, said signals each being supplied to an input of at least one comparator means which is adapted to supply a specified output signal only when the supplied signals constitute a combination of logic levels for which the impedance of the fault loop lies inside said limits, one of said signals corresponding to the current I in the fault loop, characterised in that (each of) said comparator means comprises a first, a second and a third logic component; and that one of the inputs of said second logic component is connected via a delay element to the output of said first logic component; and that the input side of said first logic component is supplied with a signal corresponding to $\overline{U}_k = \overline{I}\overline{Z}_k - \overline{U}$, where $\overline{U}$ is the voltage of the fault loop, and with said $\overline{I}$-signal; and further that said $\overline{I}$-signal and a signal corresponding to $\overline{IX}$ are supplied to respective inputs of said second logic component; and that said third logic component has an input to which said $\overline{U}_k$-signal is supplied as well as an input which is supplied with a signal which is derived from the output signal of said second logic component.

A device according to the invention has the advantage that signals may be obtained from a three-phase electric power line without complicated phase-shifting circuits. Further, it is an advantage that a very flexible and accurate setting of the operating values of the device may be easily arranged by quite simply varying the resistance and the reactance in the model impedance arranged in the circuits in a known manner.

BRIEF DESCRIPTION OF DRAWINGS

The invention will now be described, by way of example, with reference to the accompanying schematic drawings, in which FIG. 7 shows (similar to FIG. 6) the signals appearing at the noted locations in the system of FIG. 1 in the event of an external fault, but in the case where disturbances are affecting the quantity $\overline{U}_k$, defined below, FIG. 8 shows the signals appearing at the noted locations in the system of FIG. 1 under the same conditions as those applying in FIG. 7, but with suitable values for $t_1$ and $t_3$, whereby the risk of a malfunction caused by one of the above-mentioned disturbances is eliminated.

DESCRIPTION OF PREFERRED EMBODIMENTS

Figure 3:
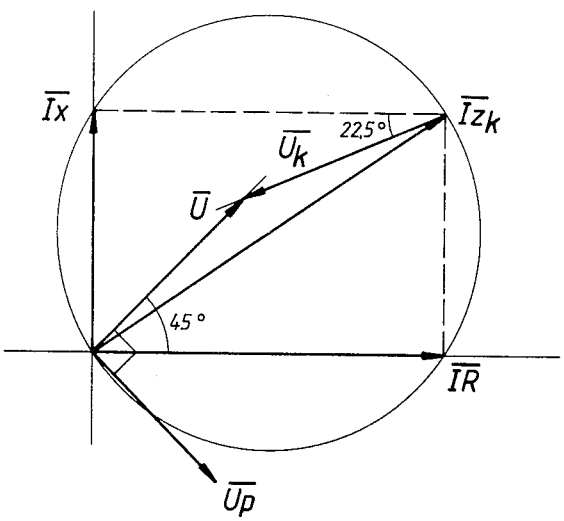
FIG. 3 is a vector diagram showing the active impedance zone for the device shown in FIG. 1 in the event of an internal fault.

Referring first to FIG. 3, this shows the relationship between the different ac quantities which are employed in the operation of the device shown in FIG. 1, the significance of the latter symbols being explained in the following:

$\overline{I}$ refers to the current in a fault loop.
$\overline{U}$ refers to the voltage of the fault loop.
$\overline{U}_p$ refers to a voltage for determining the direction.

It is chosen such that it is normally phase-shifted −90° relative to $\overline{U}$. If $\overline{U}$ is, for example, one phase voltage in a three-phase network, $\overline{U}_p$ is the difference between the other two phase voltages.

$\overline{IZ}_k$ refers to the voltage drop across a model impedance, $\overline{Z}_k = \overline{R} + j\overline{X}$, inserted in the circuit, which is variable both as regards resistance and reactance so that the desired zone of protection may be controlled.

$\overline{IR}$ refers to the resistive part of $\overline{IZ}_k$.

$\overline{IX}$ refers to a reactive part of $\overline{IZ}_k$ which is 90° ahead of $\overline{I}$ and $\overline{IR}$.

$\overline{U}_k$ refers to the compensated measuring voltage, i.e. the difference between the voltage of the fault loop and the voltage drop across the model impedance. Thus $\overline{U}_k = \overline{U} - \overline{IZ}_k$ Ac quantities corresponding to $\overline{I}$, $\overline{U}$ and $\overline{U}_p$ are obtained directly from the power supply system via intermediate transformers and are supplied, as are the derived ac quantities $\overline{IX}$ and $\overline{U}_k$, to clipping circuits, usually in the form of operational amplifiers, these quantities being transformed into corresponding signals which give polarity information only, in which the logic level "0" corresponds to one polarity and the logic level "1" corresponds to the other polarity. These signals, which in FIG. 1 are indicated by parentheses containing the corresponding ac quantities, are each supplied to a respective one of inputs ①, ②, ③ and ④ in the logic system shown in FIG. 1, this logic system together with the above-mentioned clipping circuits (not shown) constituting a phase comparator means.

Figure 1:
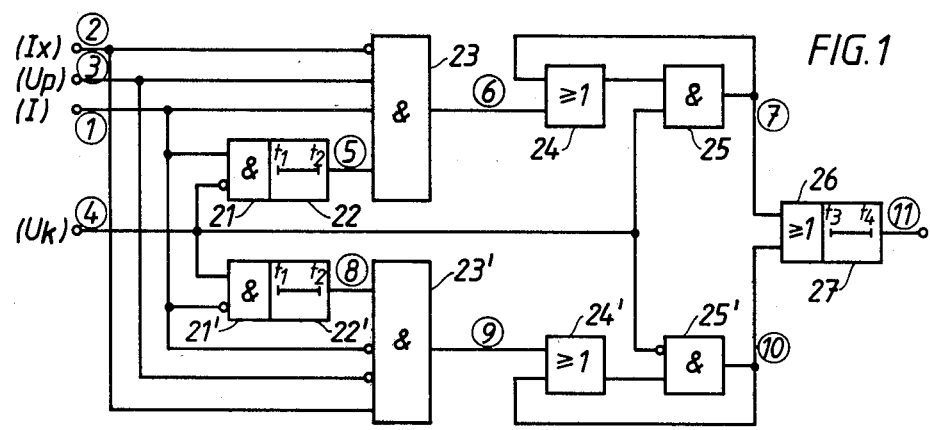
FIGS. 1 and 2 are circuit diagrams of two different logic systems, constituting separate embodiments of an impedance-measuring device according to the invention.

In FIG. 1, the numerals 21 and 21' designate two AND gates which are each provided with two inputs, one of which has a negating function. The inputs of each gate are respectively supplied with the signals ($\overline{I}$) and ($\overline{U}_k$). Each output of the two AND gates 21 and 21' is connected by way of a respective delay element 22 and 22' to an input of respective AND gates 23 and 23', which AND gates are each provided with four inputs. Each of the delay elements 22 and 22' has a delay $t_1$ when the signal changes from 0 to 1 and a delay $t_2$ when the signal changes from 1 to 0. Signals with durations shorter than $t_1$ are not therefore passed by these elements. The magnitude of the delay $t_1$ is chosen to be greater than the duration of the interferences that may occur. Suitably, $t_1$ is chosen to be greater than T/6 but smaller than T/4, where T is the period of the input signals ($\overline{I}$), ($\overline{IX}$) and ($\overline{U}_p$) of the logic system. The delay $t_2$ is preferably chosen to be considerably shorter than $t_1$. The delay $t_2$ provides a margin against malfunction caused by variation in the gate delays. The AND gates 23 and 23' are connected to the inputs ①, ② and ③ of the logic system and to outputs ⑤ and ⑧, respectively, of the delay elements 22 and 22'. Of the three inputs of the gates 23 and 23' which are not connected to a delay element, only the input of the signal ($\overline{IX}$) is negated at the gate 23, whereas the other two inputs are negated at the gate 23'. Outputs ⑥ and ⑨ of the AND gates 23 and 23' are connected to one input of the AND gates 23 and 23' are connected to one input of respective OR gates 24 and 24', which are each provided with two inputs. Each output of the OR gates 24 and 24' is connected to one input of respective AND gates 25 and 25', each provided with two inputs, to each input of which the signal ($\overline{U}_k$) is also supplied. Each output of the gates 25 and 25' (⑦ and ⑩, respectively) is connected to one input of the respective upstream OR gate 24 or 24', and also to a respective input of an OR gate 26. The output of the OR gate 26 is connected to the input side of a further delay element 27, the output ⑪ of which represents the output of the logic system shown in FIG. 1. The delay element 27 provides a pick-up delay $t_e$, which means that a circuit-breaker connected to the impedance-measuring device only receives a breaking signal if an output signal appears at the gate 26 which has a duration which is greater than $t_3$. The delay $t_3$ is chosen to be greater than the estimated duration of the interferences, but often is smaller than T/4. The delay element 27 also provides a lingering delay $t_4$, which is chosen to be long enough to ensure that the breaker is able to insulate the faulty line section.

Figure 4:
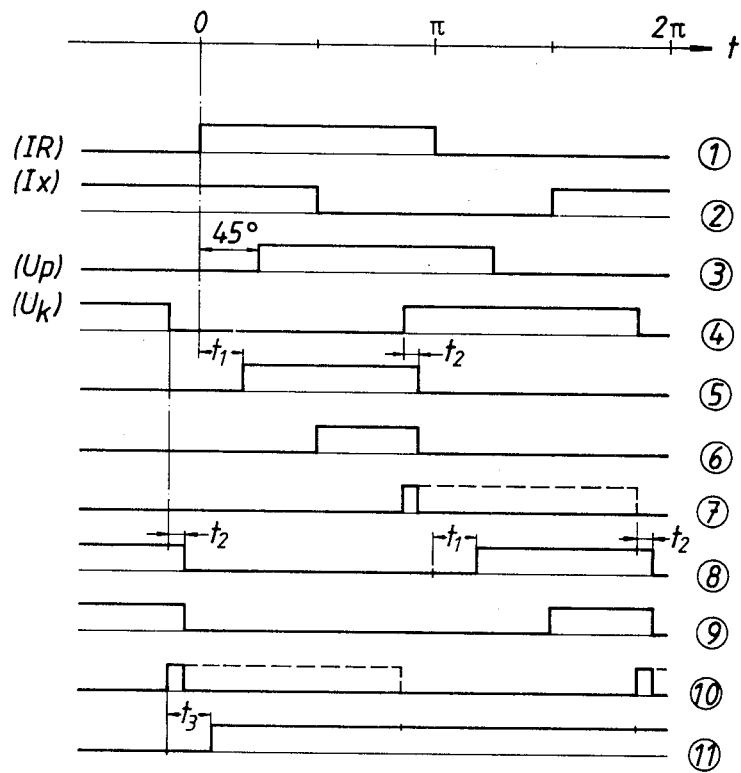
FIG. 4 is a series of graphs showing the appearance of signals appearing at different locations (marked with encircled numerals) in the logic system shown in FIG. 1, an internal fault according to FIG. 3 being assumed.

Referring now to the graphs shown in FIG. 4, the signals appearing at the points ①, ②, ③ and ④ have been obtained by means of the vector diagram of FIG. 3; however, instead of showing the full sine curves derived in a known manner from this diagram, FIG. 4 shows these curves after they have been clipped by the clipping means. The time axis is shown at the top, the marking times corresponding to certain angles of rotation of the vectors shown in FIG. 3. In each of the graphs, the lower horizontal line denotes the logic level "0" and the upper, the logic level "1". Each OR gate 24 and 24' has an output which is an elongated version of the respective output signal ⑦ and ⑩ and these OR gate outputs are shown by the dash-lined sections in FIG. 4.

It is clear from the lowest graph in FIG. 4 that the impedance-measuring device shown in FIG. 1 generates an output signal ⑪ on the occasion of an internal fault as shown in FIG. 3.

Figure 5:
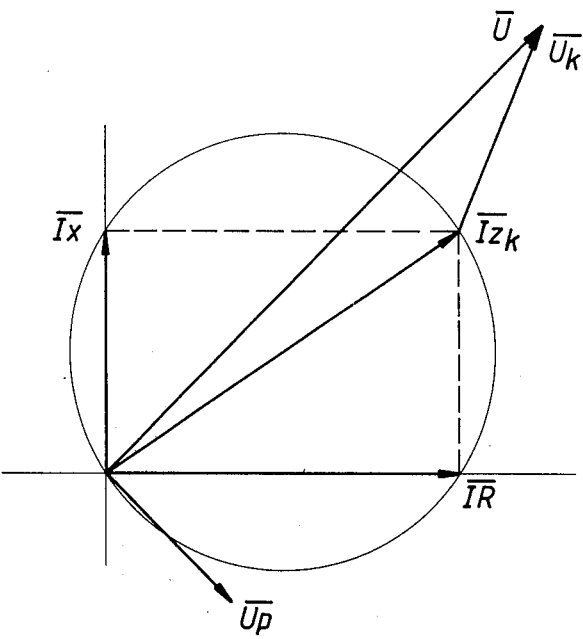
FIG. 5 shows, by means of a vector diagram, the operating principle of an impedance-measuring device in the event of an external fault.
Figure 6:
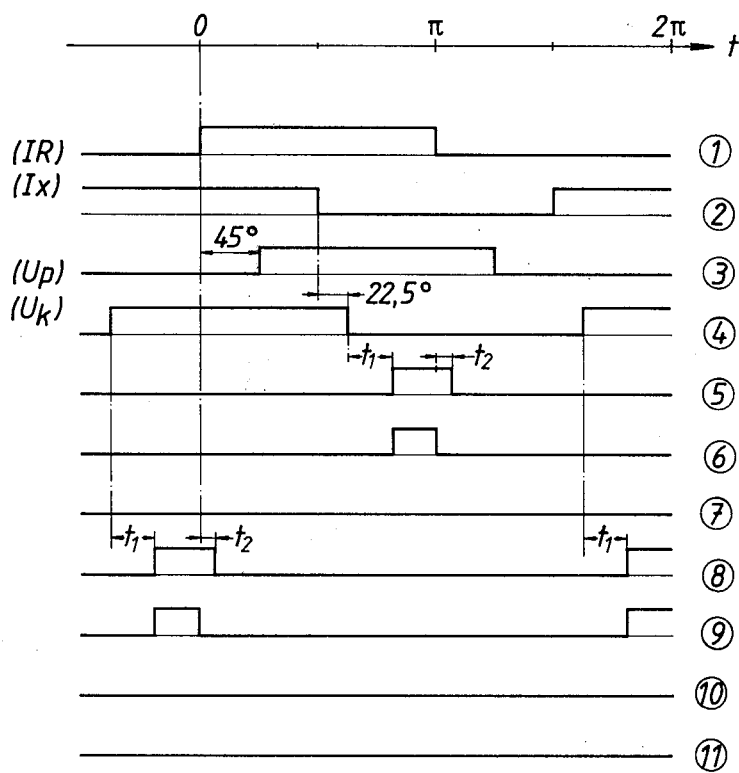
FIG. 6 is a series of graphs showing the signals appearing at the noted locations in the system of FIG. 1 in the event of an external fault, according to FIG. 5.

From FIG. 6 it is clear that the impedance-measuring device shown in FIG. 1 does not generate any output signal ⑪ on the occasion of an external fault as shown in FIG. 5.

FIG. 7 shows a situation similar to that represented by FIG. 6, but with the difference that two interference pulses, S1 and S2 appear on the input ④. In order to illustrate the importance of the pick-up delays $t_1$ and $t_3$, it has further been assumed in FIG. 7 that the delay elements 22, 22' and 27 do not provide any pick-up delay (i.e. that $t_1 = t_{33} = 0$). The absence of the pick-up delays has the result that pulses appear on the output signal ⑪, which may result in an undesired tripping of the breaker connected to the output ⑪. If, instead of choosing the delay $t_3$ to be equal to zero, it has been chosen to be greater than the duration of the pulse appearing at the point ⑩, that is, greater than the duration of the interference fault pulse S1, the first pulse, P1, of the output signal ⑪ would not have appeared. The graphs of FIG. 7 show that the pulse width of the second pulse, P2, in the graph ⑪ is not determined by the pulse width of the corresponding interference pulse in the graph ④, but by the phase angle between the graphs ② and ③ and by the phase position of the interference pulse. This means that the pulse P2 may very well have considerably greater pulse width than the example shown in FIG. 7. Pulse widths corresponding approximately to one-half of the periodic time of the line current can be expected to occur. If it is desired to make the delay $t_3$ long enough that any pulse appearing in graph ⑦—even in the case of a relatively long pulse—is prevented from giving rise to a corresponding pulse, P2, in the graph ⑪, this would involve an unacceptably large reduction of the operating speed of the impedance-measuring device.

FIG. 8 shows a situation which differs from that shown in FIG. 7 only in that neither $t_1$ or $t_3$ are equal to zero but are each given a suitable value. It is clear from the graphs of FIG. 8 that the second interference pulse, S2, in this situation, does not generate a corresponding pulse at the output ⑪, since the duration of the interference pulse, S2, is shorter than the pick-up delay $t_1$. The effect of the interference pulse, S1, on the output signal ⑪ is eliminated by choosing a value for the pick-up delay $t_3$ which is greater than the duration of the interference pulse, S1. Thus, the output signal ⑪ is unaffected by either interference pulse.

Figure 9:
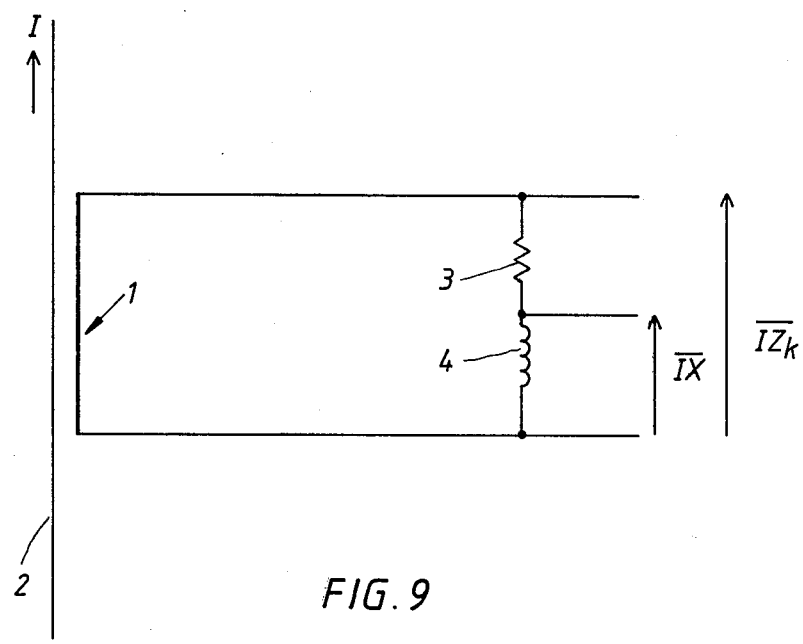
FIG. 9 shows an example of a possible arrangement of the model impedance.

FIG. 9 shows one example of a possible arrangement of the model impedance. A current transformer 1 provides an output representative of the current in a line 2. The resistor of the model impedance is indicated at 3 and the reactor in the model impedance is indicated at 4. The signal $\overline{IX}$ is thus obtained as the voltage drop across the reactor 4, and the signal $\overline{IZ_k}$ is obtained as the voltage drop across the total model impedance, $\overline{Z_k} = \overline{R} + j\overline{X}$. FIG. 9 thus shows that the signal $\overline{IX}$ does not have an ideal 90° phase shift with respect to $\overline{I}$ as it is obtained as a voltage drop across a physical reactor. Thus the phase shift is somewhat smaller than 90°, which may often be an advantage in practical applications.

The reactance of the model impedance is adapted to the reactance of the protected line section, so that a busbar lying ahead is either included or not included with a certain margin (usually 20%), by the operating characteristic of the impedance-measuring device.

The resistance of the resistor 3 is chosen to be greater than the greatest expected fault resistance in the event of a ground fault on the line, but is however usually smaller than the smallest load impedance arising during normal operation in the power supply system.

Instead of the device shown in FIG. 1, a device may be used which substantially corresponds to just the upper half or the lower half of the circuit diagram shown in FIG. 1, the delay element 27 then being connected directly to the AND gate 25 or 25'. A tripping pulse on the output ⑪ would then only appear every second half-period but this may be acceptable. The invention also embraces such a modified circuit.

Figure 2:
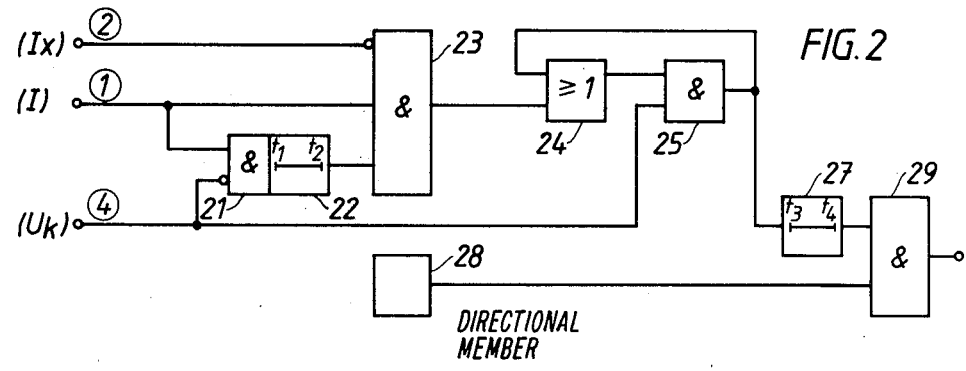

The embodiment of the invention shown in FIG. 2 differs from the half-circuit mentioned above mainly in that, instead of supplying the voltage $\overline{U}_p$ to the comparator device in order to obtain a determination of the direction, a special directional member 28 is used, which supplies a signal "1" if the power flow in the power line has such a direction that tripping of the breaker may be justified. Similar reference numerals used in FIG. 2 relate to the components so designated in FIG. 1. The delay element 27 and the directional member 28 are connected via separate outputs to the input of an AND gate 29, the output of which is connected to a tripping circuit of a circuit-breaker (not shown in the drawing).

I claim:

1. An impedance-measuring device for the impedance protection of an electric power line, comprising a comparator means built up from logic components for comparing the phase positions of a plurality of alternating current quantities which together contain information of such a nature that a phase comparison of said quantities is sufficient to obtain a criterion of whether the impedance in a fault loop lies inside or outside certain limits of an impedance zone which are defined by means of a model impedance, $\overline{Z}_k = \overline{R} + j\overline{X}$; said alternating current quantities being transformed into signals containing only polarity information, said signals each being supplied to an input of at least one comparator means which is adapted to supply a specified output signal only when the supplied signals constitute a combination of logic levels for which the impedance of the fault loop lies inside said limits, one of said signals corresponding to the current $\overline{I}$ in the fault loop, each of said comparator means comprises a first, a second and a third logic component; and that one of the inputs of said second logic component is connected via a delay element to the output of said first logic component; and that the input side of said first logic component is supplied with a signal corresponding to $\overline{U}_k = \overline{IZ}_k - \overline{U}$, where $\overline{U}$ is the voltage of the fault loop, and with said $\overline{I}$-signal; and further that said $\overline{I}$-signal and a signal corresponding to $\overline{IX}$ are supplied to respective inputs of said second logic component; and that said third logic component has an input to which said $\overline{U}_k$-signal is supplied as well as an input which is supplied with a signal which is derived from the output signal of said second logic component.

2. An impedance-measuring device according to claim 1, in which said second logic component also has an input which is supplied with a signal corresponding to a voltage $\overline{U}_p$, where $\overline{U}_p$ is phase-shifted approximately −90° with respect to the voltage of the fault loop.

3. An impedance-measuring device according to claim 1 or claim 2, in which said first, second and third logic components are AND gates, and that the outputs of said second and third logic components are connected to the inputs of an OR gate, the output of which is connected to an input of said third logic component.

4. An impedance-measuring device according to claim 1 or claim 2, in which said first logic component is an AND gate with a negated input.

5. An impedance-measuring device according to claim 1 or claim 2, further comprising an additional delay element for delaying the output of the output signal of said third logic component by a predetermined time interval.

6. An impedance-measuring device according to claim 1, in which the device further comprises two comparator means, the inputs of which are connected in parallel with each other, and that said first, second and third logic components in one comparator means each have at least one unnegated input which is connected in parallel with a negated input of corresponding logic components in the other comparator means, an OR gate having a first input for receiving the output signal of a first one of said two comparator means and a second input for receiving the output signal of the second one of said two comparator means, the output signal of said OR gate constituting the output signal of the impedance measuring device.

* * * * *